United States Patent [19]

Ansorge

[11] 4,051,384
[45] Sept. 27, 1977

[54] BLOCKING CIRCUIT FOR THYRISTORS

[76] Inventor: Werner Ansorge, Vogelbeerweg 3, 733 Villingen, Black Forest, Germany

[21] Appl. No.: 658,382

[22] Filed: Feb. 17, 1976

[30] Foreign Application Priority Data

May 9, 1975 Germany .............................. 2520626
June 12, 1975 Germany .............................. 2526304
Oct. 21, 1975 Germany .............................. 2547009

[51] Int. Cl.² .............................................. H02J 1/06
[52] U.S. Cl. ................................. 307/18; 307/252 M
[58] Field of Search ................. 321/5, 16, 45 R, 45 C; 307/252 M, 18, 24

[56] References Cited

U.S. PATENT DOCUMENTS 3,781,645  12/1973  Grom et al. ............................ 321/5
3,879,651   4/1975  Etter ................................. 321/45 C Primary Examiner—William H. Beha, Jr.
Attorney, Agent, or Firm—Robert J. Eichelburg

[57] ABSTRACT

A blocking circuit for thyristors comprises a DC power source coupled to a capacitor which is switched into a thyristor circuit by a switching transistor and auxiliary thyristor. A high power current pulse from the capacitor is applied to the thyristor for blocking purposes. A common blocking circuit may be switched into a plurality of thyristor circuits eliminating separate capacitors and power sources. In a second embodiment, a high power DC output voltage would be generated from a three phase current source by means of three full wave rectifiers coupled to achieve a charging process six times per cycle. This latter arrangement offers the possibility of saving the charging capacitor altogether as the rectified phases overlap with only a slight ripple.

7 Claims, 2 Drawing Figures

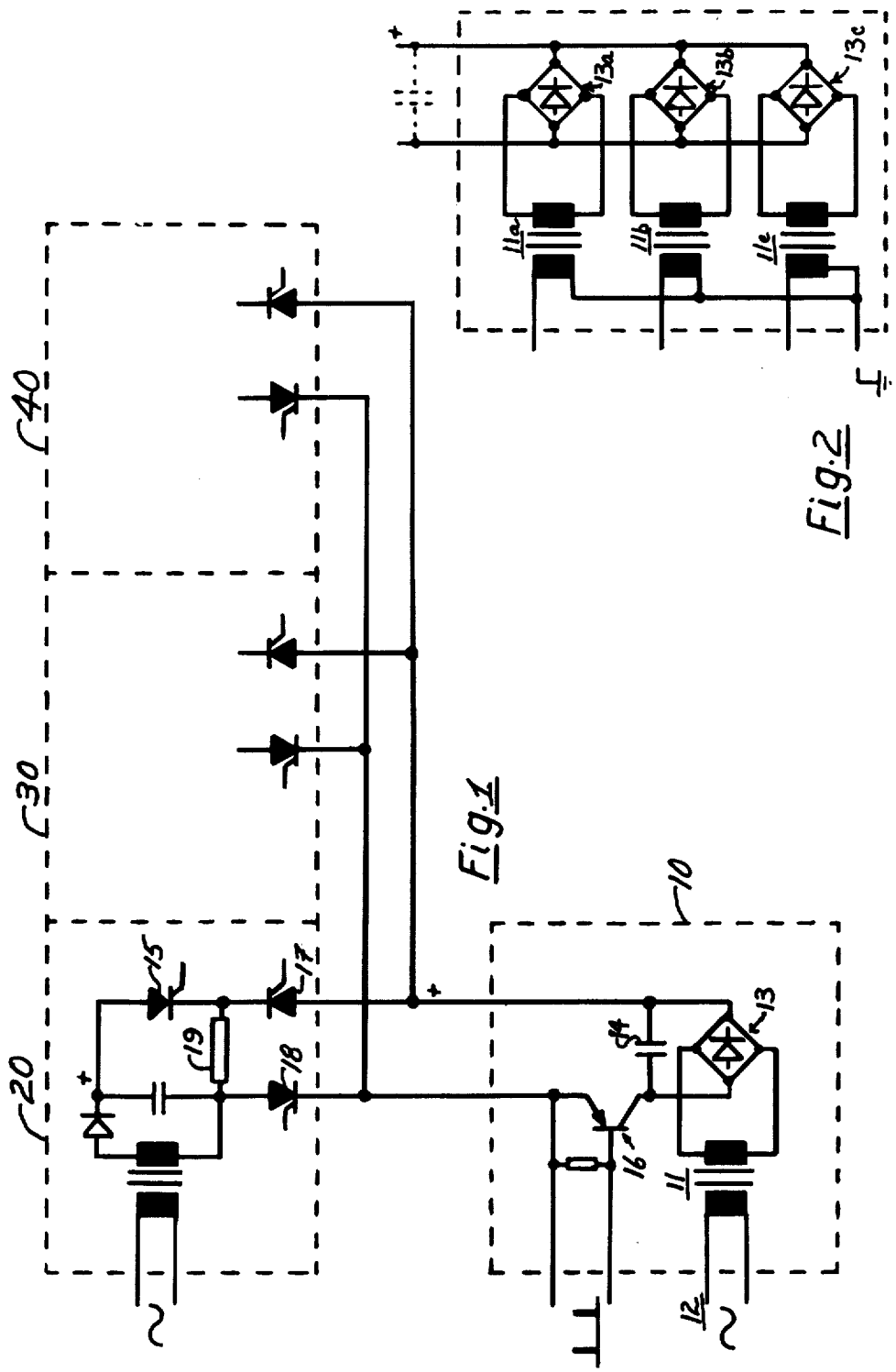

BLOCKING CIRCUIT FOR THYRISTORS

BACKGROUND OF THE INVENTION

This invention relates to DC circuit systems and particularly to thyristor circuits.

It is known in the prior art that thyristors, which are used as electronic switches in DC circuit systems, are easily triggered but difficult to block. Reverse blocking must be done with a high power current pulse which has the duration of the thyristor settling time and which absorbs the full power of the thyristor current rendering the thyristor currentless. Generally, the power pulse originates from a suitable capacitor which might be switched into the main thyristor circuit for blocking purposes.

The present invention eliminates the need for a plurality of capacitors and power sources where a number of thyristor circuits are involved. The power pulse for all thyristors is drawn from a common circuit arrangement with a DC power output and a switching transistor. Auxiliary thyristors may be provided for double-pole locking.

SUMMARY OF THE INVENTION

The present invention pertains to a new and improved thyristor blocking circuit. The invention comprises a capacitor of high capacity which is coupled into a common blocking circuit having a DC power source or suitable rectifying means connected therein. A switching transistor in the blocking circuit applies a high power current pulse to a plurality of thyristor circuits eliminating the need for separate capacitors and power through an auxiliary thyristor which itself becomes blocked after discharge of the capacitor. In instances where three phase current is used as the power source, three full wave rectifiers are employed in the blocking circuit to attain the desired charging cycle. This latter arrangement offers the possibility of eliminating the charging capacitor.

Accordingly, an object of this invention is to provide a new and improved blocking circuit for thyristors.

Another object of this invention is to provide a new and improved single blocking circuit for a plurality of thyristor circuits.

A more specific object of this invention is to provide a new and improved blocking circuit for thyristors wherein a power pulse from a capacitor is applied to the thyristors through a switching transistor and auxiliary thyristors.

BRIEF DESCRIPTION OF THE DRAWINGS

Other objects and advantages of the invention may be more clearly seen from the following description when viewed in conjunction with the accompanying drawings wherein:

FIG. 1 is a circuit diagram of the invention, and,

FIG. 2 is a partial circuit diagram of a second embodiment of the invention.

DETAILED DESCRIPTION OF THE INVENTION

Referring now to FIG. 1 of the drawings, the invention comprises a blocking circuit 10 for thyristors which is coupled to a plurality of thyristor circuits 20, 30 and 40. Since the thyristor circuits 20, 30 and 40 are essentially similar, the circuit details are illustrated only in the first circuit 20.

The blocking circuit 10 includes a transformer 11 which is connected to a power supply 12 and to the rectifier 13 in order to supply current to the capacitor 14. The high-power current pulse for reverse blocking of the thyristor 15 in circuit 20 or a corresponding thyristor (not shown) in circuits 30 and 40 originates from the capacitor 14. Thus, the power pulse for blocking all the thyristors 15, etc. is drawn not from a plurality of capacitors, but from a single capacitor 14 and a source 12. A conventionally biased switching transistor 16 is also employed within the blocking circuit 10 to direct the blocking power pulse in a predetermined manner.

The power pulse from the blocking circuit 10 is switched into the thyristor circuit 20 through an auxiliary thyristor 17. The capacitor 14 is coupled to the circuit 20 in such a way that the auxiliary thyristor 17 becomes blocked by itself after discharge of the capacitor 14. The size of the capacitor 14 is related to the thyristor switch power since reverse blocking must be accomplished with a high power current pulse having the duration of the thyristor settling time.

In order to apply power pulses to any point of the thyristor circuit 20, it is necessary to have a potential free DC source. For double pole locking, it is also necessary for each thyristor to have an additional second auxiliary thyristor 18, thus eliminating costly capacitors and various auxiliary voltages.

To avoid a large charging capacitor 14, the use of a full wave rectifier 13 is recommended. If the power source is three phase current, as in FIG. 2, three full wave rectifiers 13a, 13b and 13c are used in order to achieve a charging process of six times per complete cycle. The arrangement of FIG. 2 also offers the possibility of saving a charging capacitor for the blocking voltage altogether as the rectified phases overlap with only a slight ripple (sin 90° − sin 60° = 0.134 = 13.4%).

If the trigger pulse is switched onto circuit 20, 30 or 40 and the blocking voltage is therefore applied to the load resistor 19, the switching transistor 16 is fully conductive. This arrangement has the advantage that the pulse from the blocking voltage source to the transistor is accurately dimensionable and not produced in an undefinable manner by using the discharge curve of a capacitor with different currents under load. The pulse is available at any time, as often as desired and practically without delay to serve as a blocking impulse. The only delay is caused by the triggering time of the thyristors 17 and 18 and this is only a few micro-seconds. The transistor 16 also guarantees blocking of the thyristors 17 and 18 as it is definitively switches off the blocking current as soon as the trigger pulse stops. When the switching-off is completed, the blocking current is available for any other pair of auxiliary thyristors in the circuits 30 or 40 even if they should switch onto a completely different voltage potential. It is, of course, understood that the settling time of the auxiliary thyristors has to be taken into account.

In the foregoing description, certain circuit elements have not been described in detail since they are connected and function in a conventional manner. Only that portion of the circuit necessary to an understanding of the invention and its operation have been described in depth.

While the invention has been explained by a detailed description of certain specific embodiments, it is understood that various modifications and substitutions can be made in any of them within the scope of the appended claims which are intended also to include equivalents of such embodiments.

What is claimed is:

1. The combination comprising:
   at least two DC circuits and a thyristor blocking circuit, each of said DC circuits comprising:
   a power supply having first and second output terminals;
   a thyristor having its anode connected to said first output terminal;
   a load connected to the cathode of said thyristor, which load is connected to said second output terminal, and an auxiliary thyristor connected by its cathode to the cathode of said thyristor; and,
   said thyristor blocking circuit comprising:
   a source of unidirectional current having a pair of power supply terminals;
   a first power supply line connected to one terminal of said source of unidirectional current and to the anode of said auxiliary thyristor of each of said DC circuits;
   capacitive reactance means connected across both sides of said source of unidirectional current;
   a semi-conductor switching device coupled to the other side of said capacitive reactance means; and
   a second power supply line coupled between said semi-conductor switching device and the second power supply terminal of the current source for each of said DC circuit.

2. The combination as claimed in claim 1, wherein each DC circuit further comprises a second auxiliary thyristor having its anode connected to said second power supply terminal, and wherein the cathode of said second auxiliary thyristor is connected to said second power supply line.

3. The combination as claimed in claim 1, wherein said capacitive reactance means comprises a capacitor.

4. The combination as claimed in claim 3 wherein said semi-conductor switching device comprises a transistor, and said cacpacitor is connected in the collector circuit of said transistor; and further comprising a source of blocking pulses connected to the base circuit of said transistor.

5. The combination as claimed in claim 3, wherein said semi-conductor switching device comprises a blockable thyristor coupled to said capacitor and said second output line.

6. The combination as claimed in claim 3, wherein said source of unidirectional current comprises a three phase current supply and three separate full wave rectifiers coupled respectively to each phase of said three phase supply, and corresponding to DC terminals of said rectifiers are connected together and to said capacitor.

7. The combination comprising:
   at least two DC circuits and a thyristor blocking circuit, each of said DC circuits comprising in combination:
   a power supply having first and second output terminals;
   a thyristor having its anode connected to said first output terminal;
   a load connected to the cathode of said thyristor, which load is connected to said second output terminal; and an auxiliary thyristor connected by its cathode to the cathode of said thyristor; and,
   said thyristor blocking circuit comprises:
   a source of unidirectional current including a three-phase current supply and three full wave rectifiers coupled, respectively, to each phase of said current supply, corresponding to DC terminals of said rectifiers being connected together;
   a first power supply line connected to one set of said corresponding DC terminals of said rectifiers and said auxiliary thyristor of each said DC circuit;
   a semi-conductor switching device coupled to the other set of said corresponding DC terminals of said rectifiers; and
   a second power supply line coupled between said semi-conductor switching device and said second output terminal of the power supply to each said DC circuit.

* * * * *